US006333893B1

United States Patent
Keeth et al.

(10) Patent No.: US 6,333,893 B1
(45) Date of Patent: Dec. 25, 2001

(54) METHOD AND APPARATUS FOR CROSSING CLOCK DOMAIN BOUNDARIES

(75) Inventors: Brent Keeth; Brian Johnson, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/642,090

(22) Filed: Aug. 21, 2000

(51) Int. Cl.[7] .................................................. G11C 8/00
(52) U.S. Cl. ...................................... 365/233; 365/230.08
(58) Field of Search ................................ 365/233, 230.08

(56) References Cited

U.S. PATENT DOCUMENTS

| | | | |
|---|---|---|---|
| 4,286,255 | * 8/1981 | Siy | 340/146.3 |
| 5,487,092 | 1/1996 | Finney et al. | 375/354 |
| 5,915,107 | 6/1999 | Maley et al. | 395/551 |
| 6,000,022 | 12/1999 | Manning | 711/167 |

* cited by examiner

*Primary Examiner*—David Nelms
*Assistant Examiner*—M. Tran
(74) *Attorney, Agent, or Firm*—Dickstein Shapiro Morin & Oshinsky LLP (57) ABSTRACT

A method and apparatus that expands the data envelope of captured data to a predetermined number of clocks cycles. The predetermined number of clock cycles is large enough to ensure that an internally generated master clock edge remains within the data envelope over the entire operating range. This way, captured data remains valid and can be properly transferred to the master clock domain from a capture clock domain despite temperature and voltage variations that may effect the timing of the memory device.

33 Claims, 11 Drawing Sheets

METHOD AND APPARATUS FOR CROSSING CLOCK DOMAIN BOUNDARIES

FIELD OF THE INVENTION

The present invention relates to digital circuits and, more particularly to digital circuits employed in memory devices in which data is transferred between two independent clock domains with a predetermined timing relationship.

DISCUSSION OF THE RELATED ART

Memory devices are constantly evolving in the directions of faster speed and higher memory density. To this end, dynamic random access memory (DRAM) devices have evolved from simple DRAM devices to EDO to SRAM to DDR SDRAM to SLDRAM, the latter of which is the subject of much current industry interest. SLDRAM has a high sustainable bandwidth, low latency, low power, user upgradability and support for large hierarchical memory applications. It also provides multiple independent banks, fast read/write bus turn-around, and the capability for small fully pipelined bursts.

One characteristic of SLDRAM is that it is a double data rate device which uses both the positive- and negative-going edges of a clock cycle to READ and WRITE data to the memory cells and to receive command and FLAG data from a memory controller.

An overview of SLDRAM devices can be found in the specification entitled "SLDRAM Architectural and Functional Overview," by Gillingham, 1997 SLDRAM Consortium (Aug. 29, 1997), the disclosure of which is incorporated by reference herein.

Because of the required high speed operation of SLDRAM, and other contemporary memory devices, system timing is a very important aspect of the operation of such devices. The SLDRAM often uses an external system clock signal CCLK to capture commands and an internally generated master clock signal MCLK to perform other operations, such as data transfers. Existing SLDRAM circuits utilize delay circuits and tapped digital delay locked loop (DLL) circuits to generate required output data clocks as well as the master clock signal MCLK. Typically, the internal master clock is generated by the DLL from the external CCLK using a model of the memory device output path so that the timing, as seen by output pads of the device, is stable despite temperature and voltage variations.

While the output timing remains stable, the internal timing varies as a function of the output model. The timing of the master clock changes (i.e., experiences increased delays) by as much as 1.3 nsecs from the slow to the fast operating/process corner. The capture circuitry of the memory device typically contains delay and latching circuitry to center the external capture clock CCLK in the center of a data eye of incoming data. The delay and latching circuitry, however, also varies with temperature and voltage variations, but in a direction opposite to that of the master clock signal from the DLL. The overall clock delay variation is 1 nsec (i.e., decreased delay) from the slow to the fast operating/process corner. The net effect, however, is that the capture clock timing and master clock timing varies by 2.3 nsecs from corner to corner. The variation makes crossing the clock domains, from capture clock to master clock, very difficult since the variation is almost a full clock cycle at 800 Mb/sec (i.e., 400 MHz).

The capture latching circuitry of the memory device is designed to maintain the validity of the data bits for a full clock cycle (i.e., one rising edge and one falling edge of the clock). For a double data rate device, there is a latch for rising edge data and another latch for falling edge data. Each latch is designed to hold its respective latched data valid for one clock cycle. The period in which the data is valid is often referred to as the data eye or data envelope. For a 400 MHz system, for example, a full clock cycle (i.e., two ticks) would be approximately 2.5 nsecs.

The captured data is transferred within the master clock domain in accordance with an edge of the master clock signal MCLK (rising edge for rising edge data and falling edge for falling edge data). The placement of the master clock signal MCLK edge within the captured data envelope is optimized by selecting the DLL tap that fed the master clock signal MCLK. Unfortunately, as the operating corner is swept from a slow corner to a fast corner, the master clock signal MCLK edge that registered a given data bit moves outside of the data envelope and an earlier master clock signal MCLK edge moves inside the envelope.

Changing the master clock signal MCLK edges at the clock domain boundary changes the latency of the device, since the command essentially enters the device two ticks earlier (in relation to the master clock). The relationship between the master clock MCLK and capture clock CCLK signals is typically unknown and variable. Causes for the unknown/variable relationship between the master clock MCLK and capture clock CCLK signals include temperature and voltage variations of the device. In addition, the frequency of the device, which defines the period of the clock cycles for the master clock MCLK and capture clock CCLK signals, affects the range of phase variation between the master clock MCLK and the capture clock CCLK. This range of phase relationship is fixed for the chosen frequency of operation for the device.

These variations are compensated for by other circuitry (i.e., output model and DLL) with the intentions that each captured command bit has a data eye or data envelope that should be centered about a master clock signal MCLK edge when transferred to the master clock domain. Currently, the latching circuitry of the conventional memory device keeps the information valid only during one clock cycle (a clock cycle is two clock ticks and has a range often referred to as "$2\pi$radians"). Due to a potential $\pm 2\pi$ radians variation between the master clock MCLK and capture clock CCLK signals and another $\pm 2\pi$ radians uncertainty between the signals, however, the captured data may be clocked into the master clock domain on the wrong MCLK edge.

Accordingly, there is a need and desire to keep the master clock edge within the capture data envelope over the entire operating range despite temperature and voltage variations that may effect the timing of the memory device. It is also desirable to establish a relationship between the master clock and capture clock signal and to maintain the relationship to keep the master clock edge within the capture data envelope over the entire operating range despite variations that may effect the timing of the memory device.

SUMMARY OF THE INVENTION

The present invention provides a memory device that keeps a master clock edge within the capture data envelope over the entire operating range of the device despite temperature and voltage variations that may effect the timing of the memory device.

The above and other features and advantages are provided by a method and apparatus that expands the data envelope of captured data to a predetermined number of clocks cycles.

The predetermined number of clock cycles is large enough to ensure that an internally generated master clock edge remains within the data envelope over the entire operating range of the memory device. This way, captured data remains valid and can be properly transferred to the master clock domain from a capture clock domain despite temperature and voltage variations that may effect the timing of the memory device.

BRIEF DESCRIPTION OF THE DRAWINGS

The above and other advantages and features of the invention will be more clearly understood from the following detailed description of the invention which is provided in connection with the accompanying drawings in which.

DETAILED DESCRIPTION OF THE PREFERRED EMBODIMENTS

The invention described below establishes and maintains a known relationship between the master and capture clock signals. The capture data envelope of captured rising edge and falling edge data is increased by two full clock cycles such that the captured data remains valid for three fill clock cycles (i.e., has a data envelope of three clock cycles or six clock ticks). The expanded valid data operating range, now $6\pi$ radians as opposed to $2\pi$ radians, is large enough to ensure that the edges of the master clock signal MCLK remain within the data envelope over the entire operating range. This way, captured data remains valid and can be properly transferred to the master clock domain from the capture clock domain despite temperature and voltage variations that may effect the timing of the memory device.

Figure 1:
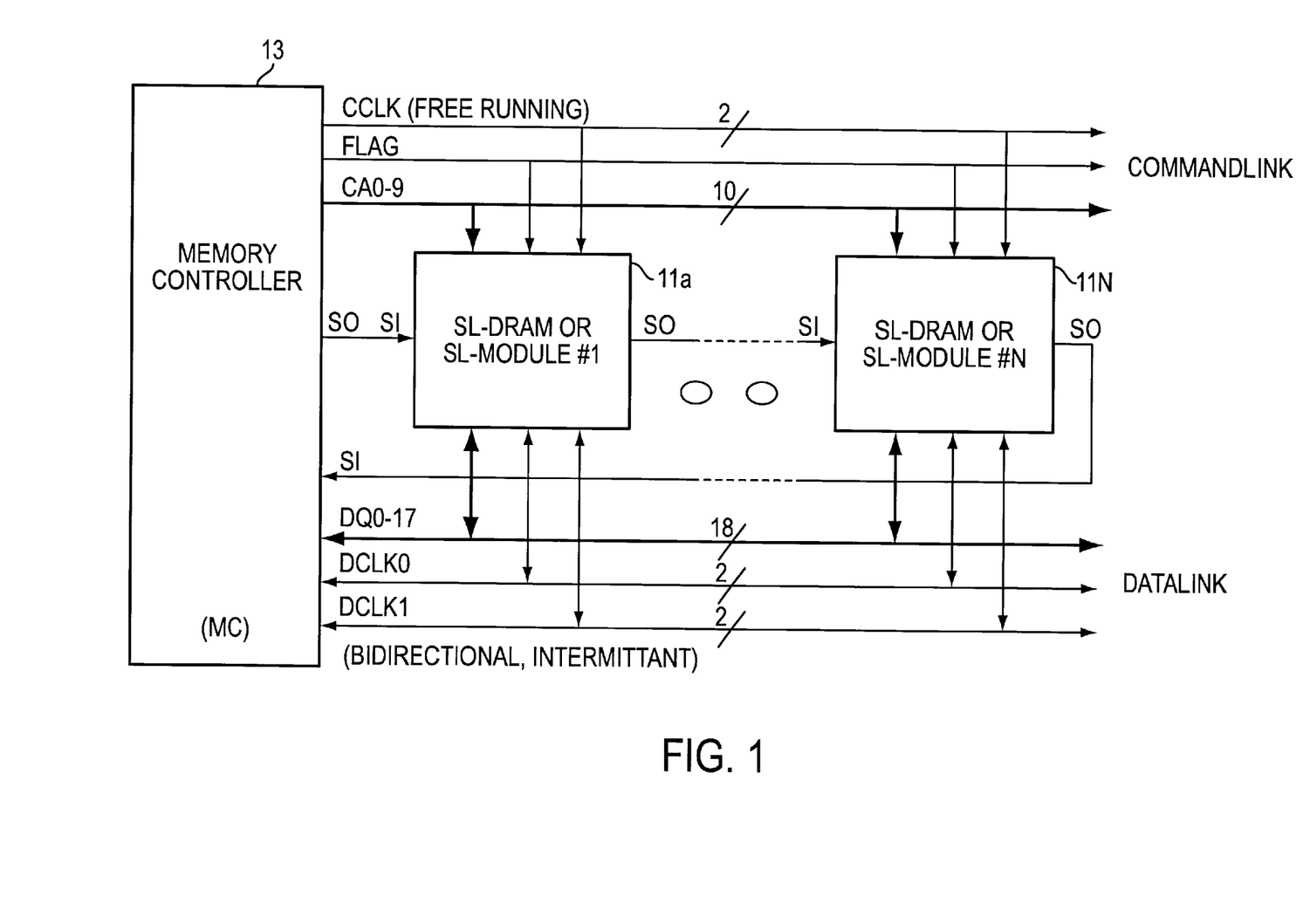
FIG. 1 is circuit diagram illustrating an SLDRAM bus topology with which the invention may be used.

An SLDRAM system with which the present invention may be used is illustrated in FIG. 1. The system includes a plurality of SLDRAM modules $11a, \ldots, 11n$, which are accessed and controlled by a memory controller 13. The memory controller 13 provides a command link to each of the SLDRAM modules $11a, \ldots, 11n$, which includes a clock signal CCLK on inverted and non-inverted clock signal paths, a one bit FLAG signal on a FLAG data path, and a ten bit command bus data path CA0–CA9. In addition, SLDRAM input/output enabling signals SO, SI are provided from the memory controller 13 in a daisy chain fashion to the SLDRAM modules $11a, \ldots, 11n$. In addition, a bi-directional data bus DQ0–DQ17 is provided between the memory controller 13 and each of the SLDRAM modules $11a, \ldots, 11n$, as are bi-directional data clocks DCLK0 and DCLK1. The first data clock DCLK0 is used to strobe input/output data into and out of the SLDRAM modules, a process for which the second data clock DCLK1 signal path is also intermittently used.

Figure 2:
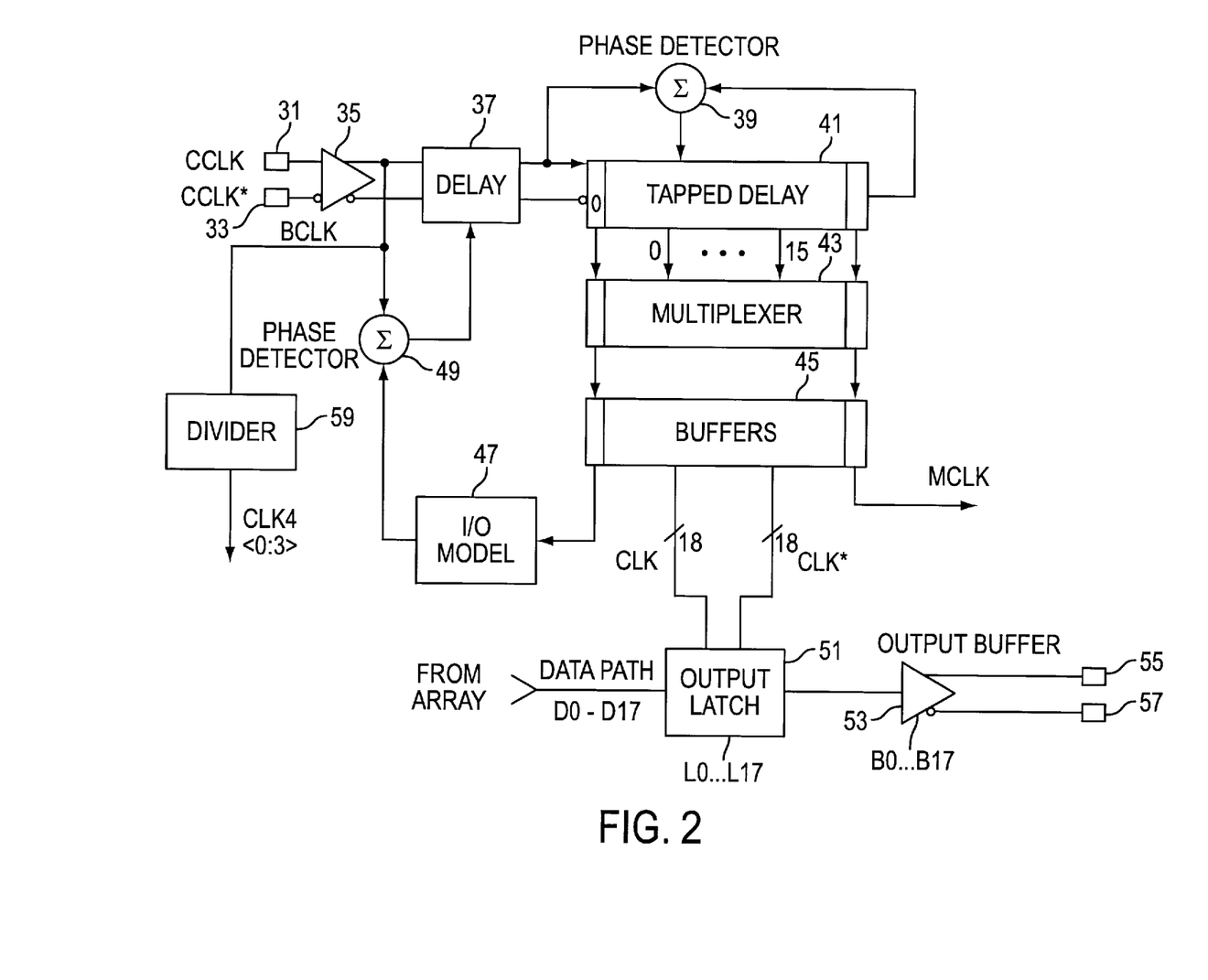
FIG. 2 is a circuit diagram illustrating an exemplary memory device circuit for generating a master clock signal from a capture clock signal.

In order to understand the invention, the manner in which the master clock signal MCLK is conventionally derived in a memory device is illustrated with respect to FIG. 2. FIG. 2 shows a circuit for deriving various clock signals used in the operation of a memory device. External clock signals CCLK and CCLK*, which are typically used to latch data into a memory device, are received at terminals 31 and 33 and provided through a buffer 35 to an adjustable delay circuit 37, the output of which feeds the delayed CCLK and CCLK* signals into a tapped delay line 41.

The tapped delay line 41 has a plurality of taps which provide delayed clock signals $0, \ldots, 15$ to multiplexers 43 which are capable of providing selected ones of the clock signals $0, \ldots, 15$ to selected ones of the buffers 45. The buffers 45 in turn supply respective delayed clock signals CCLK and CCLK* to respective output latches 51 of data paths D0, ..., D17 for READ/WRITE data of the memory device. The output latches 51 in turn supply read data from a memory array to respective output buffers 53 and output terminals 55 and 57.

One of the delayed signals from tapped delay line 41, for example, one provided at the last stage of the tapped delay line 41, is provided to the multiplexer 43 in a manner in which the signal passes through the multiplexer without being switchable to a selected buffer 45. This signal that passes through multiplexer 43 and through buffer 45 is the master clock signal MCLK which is used to time various operations within a memory device.

Another clock output signal, for example, at the beginning of the tapped delay line 41 (tap 0) , is also provided as a clock signal which passes straight through the multiplexer 43 and the buffer 45 as an input to an input/output model circuit 47. The input/output model circuit 47 is a circuit which is designed to provide a specific delay to the signals CCLK and CCLK* through the adjustable delay circuit 37 in accordance with designed operating parameters of the memory device and in response to changes in operating voltage and/or temperature of the device. To this end, the clock signal at tap 0 supplied to input/output model circuit 47, and after being adjusted based on the parameters of voltage and temperature, is provided as an input into the phase detector 49, which receives at another input the clock signal CCLI(also relabeled BCLK (buffered clock). The output of the phase detector 49 is used to adjust the delay circuit 37 to adjust the timing of the applied clock signal CCLK in accordance with voltage and temperature variations experienced by the memory device.

FIG. 2 also illustrates a phase detector 39 which is used to adjust the length of the tapped delay line 41 such that it remains at a constant length, such as one clock cycle. The phase detector 39 operates by comparing the output to the input of the tapped delay line 41 and making the necessary adjustments thereto to ensure that the delay length remains stable.

As is evident from FIG. 2, the adjustable delay circuit 37 causes timing adjustments in the input signal to the tapped delay line 41, which in turn cause like timing adjustments in the master clock signal MCLK.

Figure 3:
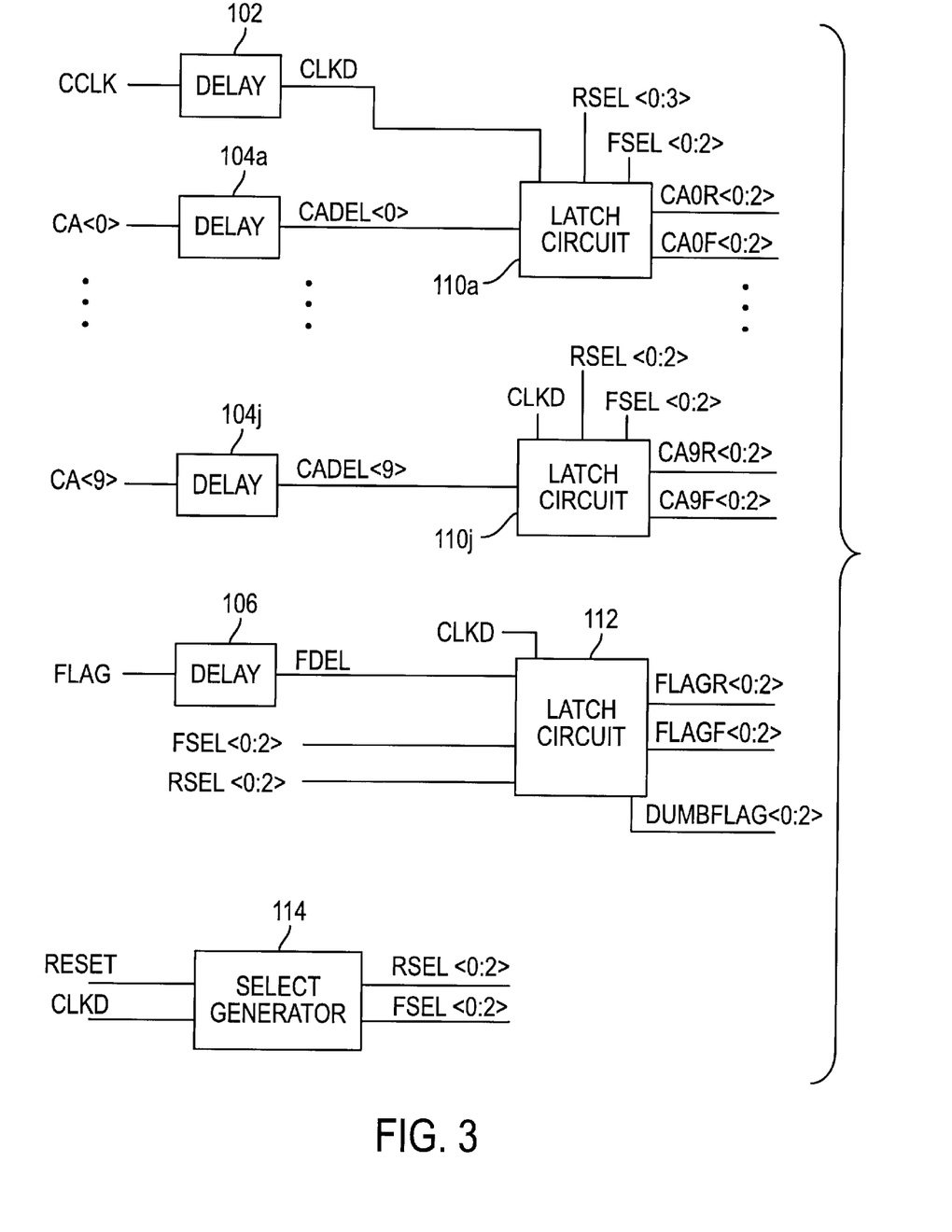
FIG. 3 illustrates an exemplary portion of a memory device circuit for capturing data and expanding the capture data envelope in accordance with an exemplary embodiment of the invention.

FIG. 3 illustrates an exemplary portion of a memory device circuit for capturing data and expanding the capture data envelope in accordance with an exemplary embodiment of the invention. The circuit receives the capture clock signal CCLK, the command bits CA<0:9>, a flag signal FLAG and a reset signal RESET as inputs. As known in the art, the flag signal FLAG is received to signify the start of a command packet. As also known in the art, a command packet consists of four command packet words each of which consists of command bits CA<0:9>, that is, each of the CA0, . . . , CA9 data paths receives a four-bit data burst for command transfer to the memory device.

The capture clock signal CCLK is input in to a clock delay circuit 102. The clock delay circuit 102 outputs a delayed clock signal CLKD. The command bits CA<0:9> are input into respective command delay circuits 104*a*, . . . , 104J (collectively referred to herein as "command delay circuits 104"). It should be noted that there are ten command delay circuits 104 for the command data paths CA0, . . . , CA9, but only two are illustrated for clarity purposes. The outputs of the command delay circuits are delayed command signals CADEL<0:9>. The flag signal FLAG is input in to a flag delay circuit 106. The flag delay circuit 106 outputs a delayed flag signal FDEL.

It is desirable for the delay circuits 102, 104, 106 to be ring delay circuits. Exemplary ring delay circuits and their operation are described in U.S. patent application Ser. No. 09/201,519, filed on Nov. 30, 1998, entitled "Method and Apparatus for High Speed Data Capture Utilizing Bit-to-Bit Timing Correction, and Memory Device Using the Same," which is hereby incorporated by reference in its entirety.

Briefly, a description of the operation of the ring delay circuits and thus, delay circuits 102, 104, 106, now follows. The ring delay circuits consist of a plurality of delay circuits connected as a ring having an output with an adjustable delay (depending upon where the data is input into the ring, i.e., the "insertion point"). At initialization and reset, an initial insertion point of the ring delay circuit is chosen and a calibration pattern is sent down a data path. An output of the ring delay circuit is sampled to determine if the calibration pattern has been properly captured and to determine its timing. All of the possible insertion points (i.e., delay values) are sampled and tested to derive a window of acceptable delays for the ring delay circuit, that is, delays which produce a proper capturing of the calibration pattern. Once all of the acceptable delays have been determined, a memory device control circuit determines the best delay value for the ring delay circuit and sets the ring delay circuit to this value. The best delay typically corresponds to a data envelope centered about the delayed clock signal CLKD.

Figure 4:
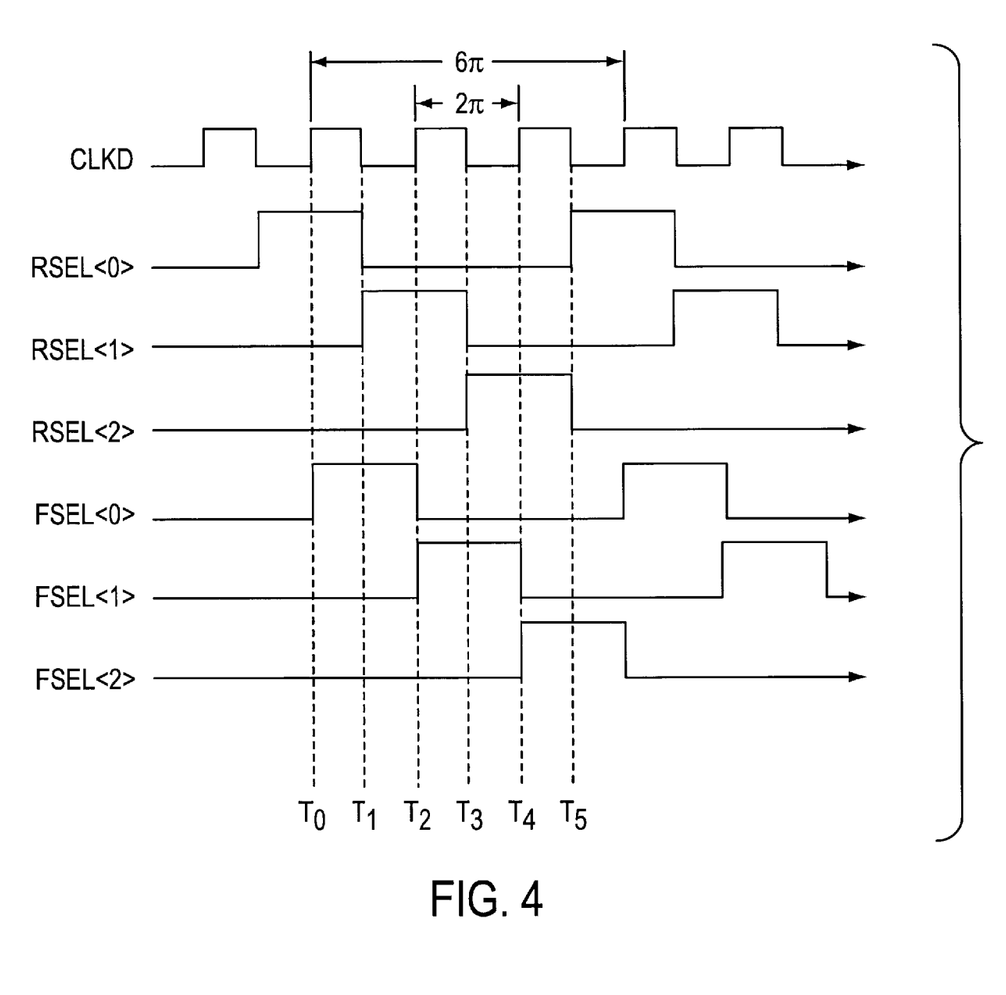
FIG. 4 is a timing diagram illustrating the signals used to latch captured data in accordance with an exemplary embodiment of the invention.

A select signal generator 114 receives the delayed clock signal CLKD and the reset signal RESET. The select signal generator 114 outputs three rising select signals RSEL<0:2> and three falling select signals FSEL<0:2>. Referring to FIG. 4, it can be seen that the select signal generator 114 generates the first rising select signal RSEL<0> off the falling edge of CLKD such that RSEL<0> corresponds to and centers on the first rising edge of the delayed clock signal CLIQ at time t0. Similarly, the select signal generator 114 generates the second and third rising select signals RSEL<1:2> centered at times t2 and t4, which correspond to the second and third rising edges of the delayed clock signal CLKD. Moreover, the select signal generator 114 generates the three falling select signals FSEL<0> centered at times t1, t3 and t5, which respectively correspond to the first, second and third falling edges of the delayed clock signal CLKD. As will become apparent from the following description, the rising and falling select signals RSEL<0:2>, FSEL<0:2> enable one of the registers of command latch circuitry so that the delayed clock signal CLKD can latch the data on the input to the corresponding register.

Referring again to FIG. 3, the circuit contains ten command latch circuits 110*a*, . . . , 110J (collectively referred to herein as the "command latch circuits 110"). It should be noted that there are ten command latch circuits 110, but only two are illustrated for clarity purposes. The command latch circuits 110 respectively receive the delayed command signals CADEL<0:9>, delayed clock signal CLKD, and the rising and falling select signals RSEL<0:2>, FSEL<0:2>.

The command latch circuits 110 contain three latched rising edge command outputs CA0R<0:2>, . . . , CA9R<0:2> and three latched falling edge command outputs CA0F<0:2>, . . . , CA9F<0:2>. Typically only two latched rising edge command signals and two latched falling edge command signals will be output from each command latch circuit 110 (i.e., since there are four command packet words there are two rising edge command bits and two falling edge command bits input into latch circuit 110). As will be described below in more detail with respect to FIG. 9, each command latch circuit 110 contains six latches and six possible outputs. Thus, each command latch circuit 110 may have three latched rising edge command signals and three latched falling edge command signals in certain circumstances.

Figure 8:
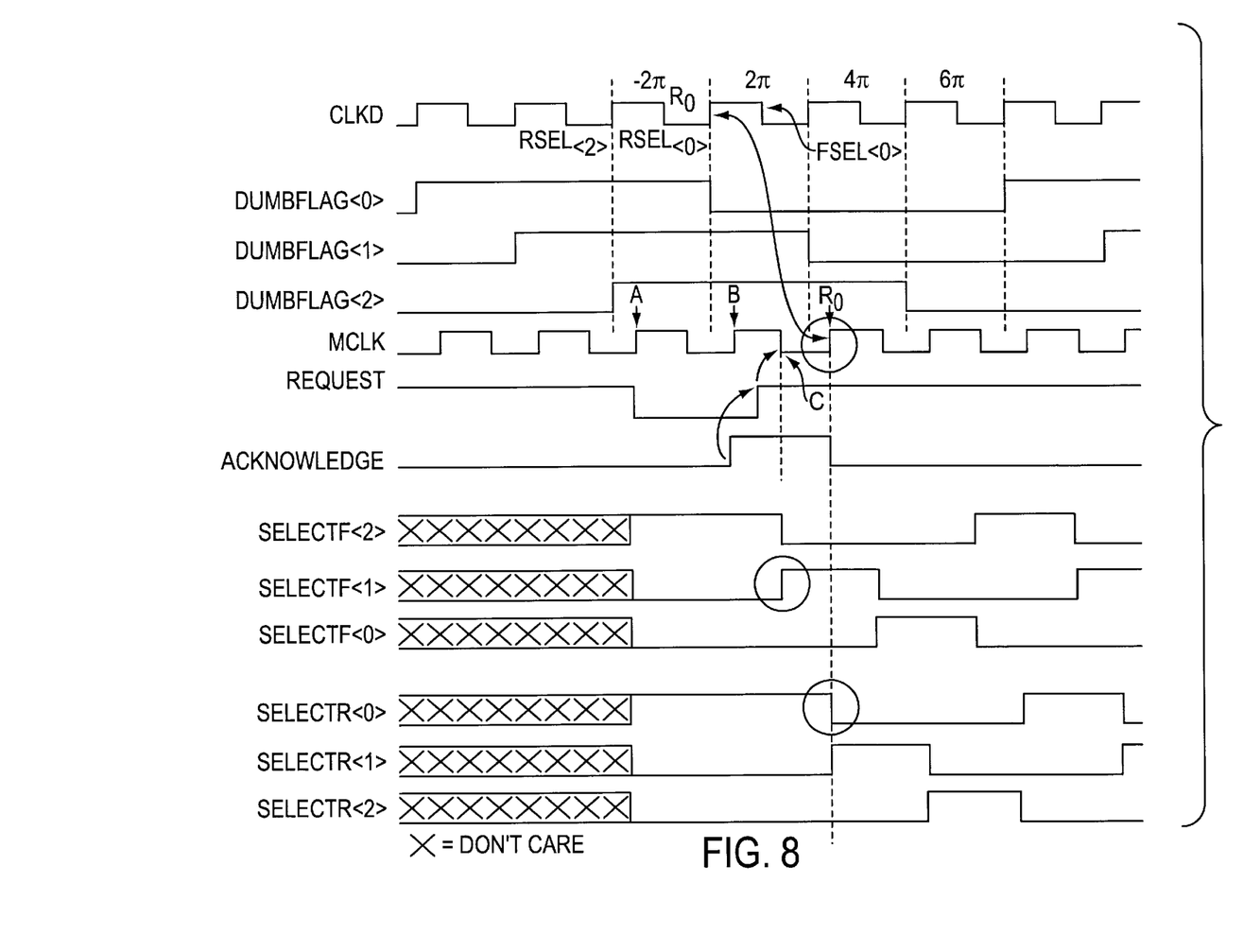
FIG. 8 is a timing diagram illustrating the signals used to synchronize the capture data.

The circuit also contains one flag latch circuit 112. The flag latch circuit 112 receives the delayed flag signal FDEL, delayed clock signal CLKD, and the rising and falling select signals RSEL<0:2>, FSEL<0:2>. The flag latch circuit 112 contains three latched rising edge flag outputs FLAGR<0:2>, three latched falling edge flag outputs FLAGF<0:2> and three latched dummy flag outputs DUMBFLAG<0:2>. Referring to FIG. 8, the three latched dummy flag outputs DUMBFLAG<0:2> are latched by the flag latch circuit 112 such that they have a data envelope that spans three full clock cycles (i.e., six clock ticks). Thus, the three latched dummy flag outputs DUMBFLAG<0:2> simulate the desired data envelope for the captured data (although the proper timing has yet to be determined). The three latched dummy flag outputs DUMBFLAG<0:2> are skewed from each other by one full clock cycle.

As will be discussed below, the latched dummy flag outputs DUMBFLAG<0:2> will be used to synchronize the capture clock latching circuitry to the master clock latching circuitry. The latched rising edge command outputs CA0R<0:2>, . . . , CA9R<0:2> and latched falling edge command outputs CA0F<0:2>, . . . , CA9F<0:2> will be used by a data generator circuitry to transfer the captured information to the master clock domain by increasing the capture data envelope to three clock cycles (i.e., six clock ticks) to ensure that an internally generated master clock edge remains within the data envelope over the entire operating range.

Figure 5:
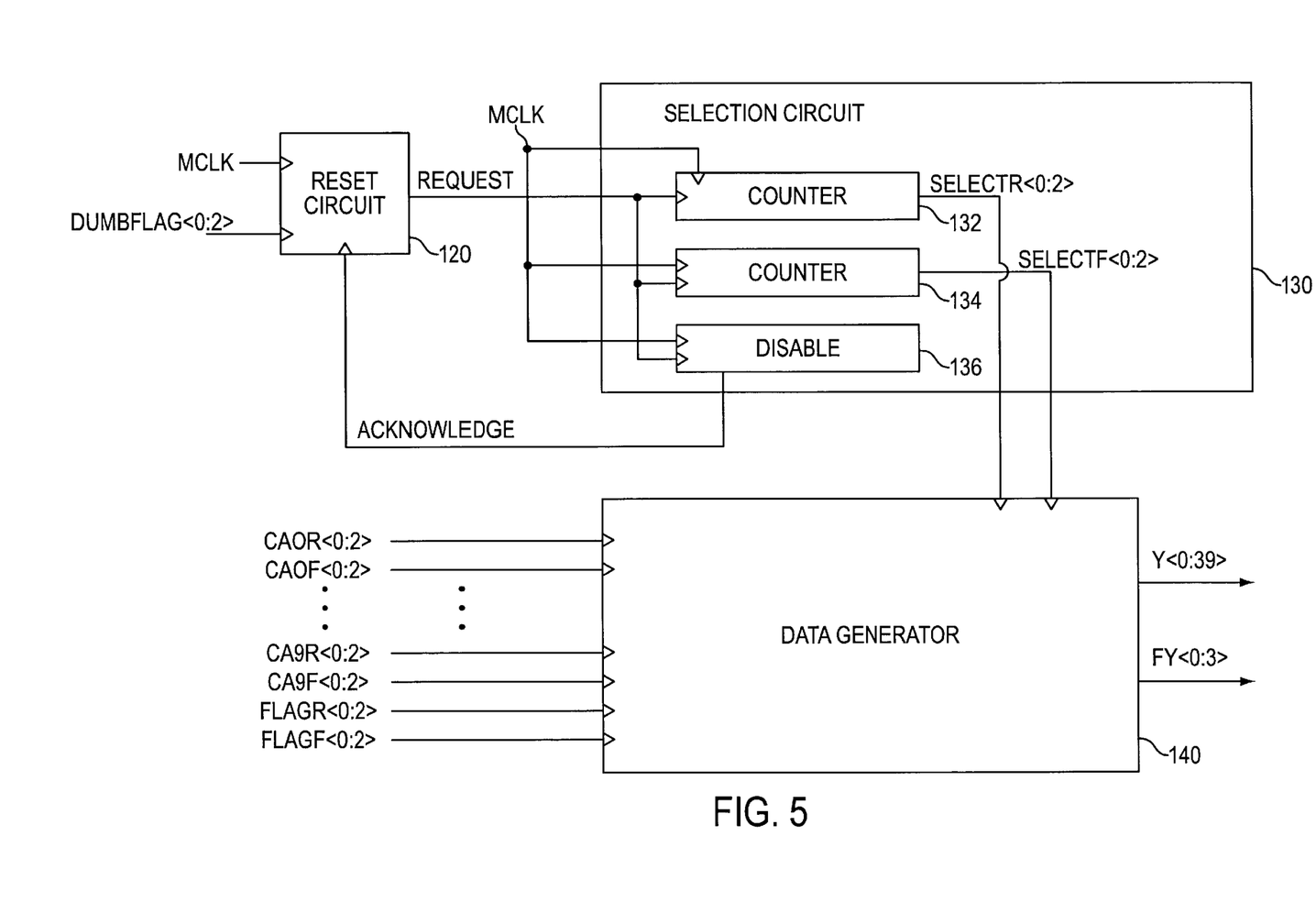
FIG. 5 is a circuit diagram illustrating an exemplary portion of synchronization and re-timing circuitry constructed in accordance with an exemplary embodiment of the invention.

FIG. 5 is a circuit diagram illustrating an exemplary portion of synchronization and re-timing circuitry constructed in accordance with an exemplary embodiment of the invention. The circuitry includes a reset circuit 120 and a selection circuit 130 that synchronize the capture circuitry clocked by the delayed capture clock signal CLKD (illustrated in FIG. 3) to the circuitry clocked by the master clock signal MCLK. A data generator 140 transfers the captured commands with the expanded data envelope, i.e., latched rising edge command outputs CA0R<0:2>, ..., CA9R<0:2> and latched falling edge command outputs CA0F<0:2>, ..., CA9F<0:2>, to the master clock domain.

The reset circuit 120 receives the master clock signal MCLK and the latched dummy flag outputs DUMB-FLAG<0:2> as inputs. At power-up, when the capture clock signal CLKD and the master clock signal MCLK are being generated and before any command bits are received, the flag latch circuit 112 (FIG. 3) generates the three latched dummy flag outputs DUMBFLAG<0:2> that simulate the desired capture data envelope (i.e., three full clock cycles). As will be described below, the flag latch circuit 112 (FIG. 3) will contain circuitry that generates the three latched dummy flag outputs DUMBFLAG<0:2> without the need to input a flag signal FLAG and thus, the desired envelope can be generated and the proper timing can be established prior to the receipt of any commands or data.

After power-up, the reset circuit 120 monitors the three latched dummy flag outputs DUMBFLAG<0:2> and issues a reset request signal REQUEST to the selection circuit 130. Referring again to FIG. 8, the reset request signal REQUEST is generated by the reset circuit 120 when an edge of the master clock signal MCLK is simultaneously within the data envelopes of all three latched dummy flag outputs DUMBFLAG<0:2>.

The reset request signal REQUEST is output to the selection circuit 130. The selection circuit 130 includes two counters 132, 134 that respectively generate three rising edge select signals SELECTR <0:2> and three falling edge select signals SELECTF <0:2> that are clocked by the master clock signal MCLK. The selection circuit 130 also includes a disable circuit 136 that sends an acknowledgment signal ACKNOWLEDGE to the reset circuit 120. The reset circuit 120 uses the acknowledgment signal ACKNOWLEDGE to prevent the generation of subsequent reset request signals REQUEST (i.e., the reset circuit 120 is disabled). The reset circuit 120 is disabled at this point because the timing between the master clock signal MCLK and the capture data envelope has been established (described below in more detail). The three rising edge select signals SELECTR <0:2> and three falling edge select signals SELECTF <0:2> are output to the data generator 140 so that captured command data (i.e., the latched rising edge command outputs CA0R<0:2>, ..., CA9R<0:2> and the latched falling edge command outputs CA0F<0:2>, ..., CA9F<0:2>) can be transferred to the master clock domain.

Thus, the master clock signal MCLK will be synchronized with the capture data envelope that was clocked by the delayed capture clock signal CLKD. Once synchronized and after the reset circuit 120 is disabled, when command and other information is captured by the capture clock signal CLKD the information will remain valid for three fall clock cycles, which ensures that it can be transferred to the master clock domain.

Figure 6:
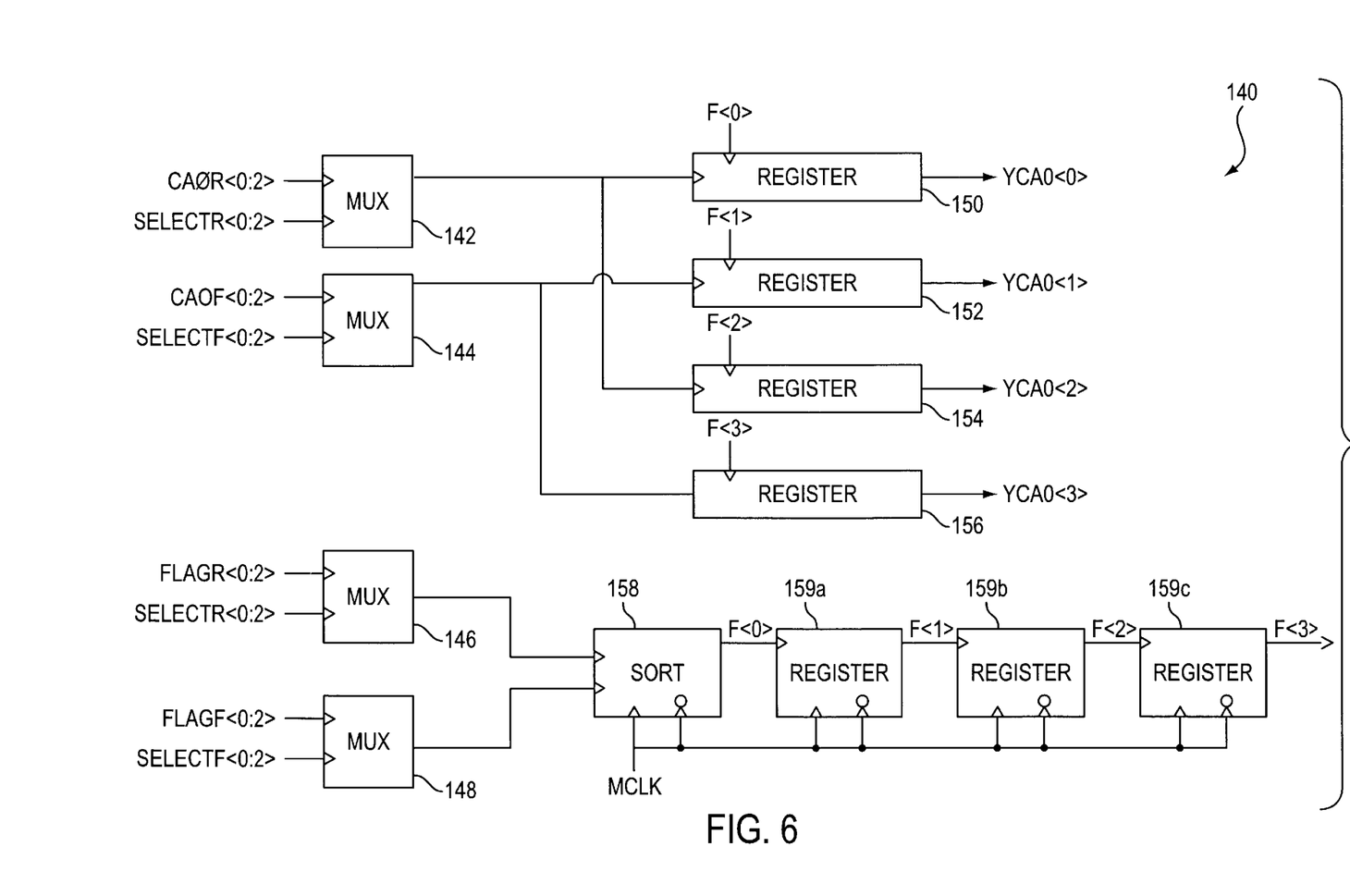
FIG. 6 is a circuit diagram illustrating an exemplary data generator circuit constructed in accordance with an exemplary embodiment of the invention.

FIG. 6 is a circuit diagram illustrating an exemplary data generator circuit 140. The data generator 140 receives the latched rising edge command outputs CA0R<0:2>, ..., CA9R<0:2>, latched falling edge command outputs CA0F<0:2>, ..., CA9F<0:2>, rising edge select signals SELECTR <0:2>, falling edge select signals SELECTF <0:2>, latched rising edge flag outputs FLAGR<0:2> and the latched failing edge FLAG outputs FLAGF<0:2>. It should be noted that only the first latched rising and falling edge command outputs CA0R<0:2>, CA0F<0:2> are illustrated for clarity purposes. Moreover, it should be noted that the circuitry (e.g., multiplexers 142, 144 and registers 150, 152, 154, 156) connected to the first latched rising and falling edge command outputs CA0R<0:2>, CA0F<0:2> is repeated for every command output, but they are not illustrated for clarity purposes.

The latched rising edge command outputs CA0R<0:2> and the rising edge select signals SELECTR <0:2> are input into a first command bit multiplexer 142. The latched falling edge command outputs CA0F<0:2> and the falling edge select signals SELECTF <0:2> are input into a second command bit multiplexer 144. Each command bit multiplexer 142, 144 is a three-to-one multiplexer and is controlled by its respective select signals SELECTR<0:2>, SELECTF<0:2> to output the two latched command bits (from the same command packet) contained within its respective latched command outputs CA0R<0:2>, CA0F<0:2>. The outputs of the first command bit multiplexer 142 are sent to the first and third registers 150, 154. The outputs of the second command bit multiplexer 144 are sent to the second and fourth registers 152, 156.

The first register 150 is clocked by a first master clock flag signal F<0> and outputs a first command bit output YCA0<0>. The first command bit output YCA0<0> represents the first captured command bit CA<0> from the first packet word of a command packet that has now been transferred into the master clock domain. Similarly, the second register 152 is clocked by a second master clock flag signal F<1> and outputs a second command bit output YCA1<0>. The second command bit output YCA1<0> represents the first captured command bit CA<0> from the second packet word of a command packet that has now been transferred into the master clock domain. The third register 154 is clocked by a third master clock flag signal F<2> and outputs a third command bit output YCA2<0>. The third command bit output YCA2<0> represents the first captured command bit CA<0> from the third packet word of a command packet that has now been transferred into the master clock domain. The fourth register 156 is clocked by a fourth master clock flag signal F<3> and outputs a fourth command bit output YCA3<0>. The fourth command bit output YCA3<0> represents the first captured command bit CA<0> from the fourth packet word of a command packet that has now been transferred into the master clock domain.

The generation of the master clock flag signals F<0>, F<1>, F<2>, F<3> is now described. The latched rising edge flag outputs FLAGR<0:2> and the rising edge select signals SELECTR <0:2> are input into a first flag multiplexer 146. The latched falling edge FLAG outputs FLAGF<0:2> and the falling edge select signals SELECTF <0:2> are input into a second flag multiplexer 148. Each flag multiplexer 146, 148 is a three-to-one multiplexer and is controlled by its respective select signals SELECTR<0:2>, SELECTF<0:2> to output the two latched flag signals contained within its respective latched flag outputs FLAGR<0:2>, FLAGF<0:2>. The outputs of the two flag multiplexers 146, 148 are input into a sorting circuit 158. The sorting circuit 158, which is clocked by the rising and failing edges of the master clock signal MCLK, outputs a first master clock flag signal F<0>. The first master clock signal F<0> is fed into a first dual edge register 159a, which outputs the second master clock signal F<1>. The second master clock signal F<1> is fed into a second dual edge register 159b, which outputs the third master clock signal F<2>. The third master clock signal F<2> is fed into a third dual edge register 159c, which outputs the fourth master clock signal F<3>.

The master clock flag signals F<0>, F<1>, F<2>, F<3> respectively signify the arrival of the four latched command outputs for a single command bit. That is, the first master clock flag signal F<0> is used to signify the arrival of the latched command output CA0R<0:2> that is associated with the command bit 0 (i.e., CA<0>) of the initial captured packet word. The second master clock flag signal F<1> is used to signify the arrival of the latch command output CA0F<0:2> that is associated with the command bit 0 (i.e., CA<0>) of the second captured packet word. The third master clock flag signal F<2> is used to signify the arrival of the latch command output CA0R<0:2> that is associated with the command bit 0 (i.e., CA<0>) of the third captured packet word. The fourth master clock flag signal F<3> is used to signify the arrival of the latch command output CA0F<0:2> that is associated with the command bit 0 (i.e., CA<0>) of the fourth captured packet word.

As noted above, the command bit outputs YCA0<0:3>, YCA1<0:3>, YCA2<0:3>, ..., YCA9<0:3> are output from the data generator 140. Referring again to FIG. 5, the designation Y<0:39> is used to represent the command bit outputs YCA0<0:3>, YCA1<0:3>, YCA2<0:3>, ..., YCA9<0:3>. In addition, if desired, the data generator 140 can also output the four master clock flag signals F<0:3>. This is represented on FIG. 5 as the output labeled FY<0:3>.

Thus, the circuitry described above with respect to FIGS. 1–3, and 5–6 increases the capture data envelope by two full clock cycles such that captured data remains valid for three full clock cycles (i.e., has a data envelope of three clock cycles or six clock ticks). The expanded valid data operating range, now 6π radians as opposed to 2π radians, is large enough to ensure that a particular edge of the master clock signal MCLK remains within the data envelope over the entire operating range. This way, captured data remains valid and can be properly transferred to the master clock domain from the capture clock domain despite temperature and voltage variations that may effect the timing of the memory device.

Figure 7:
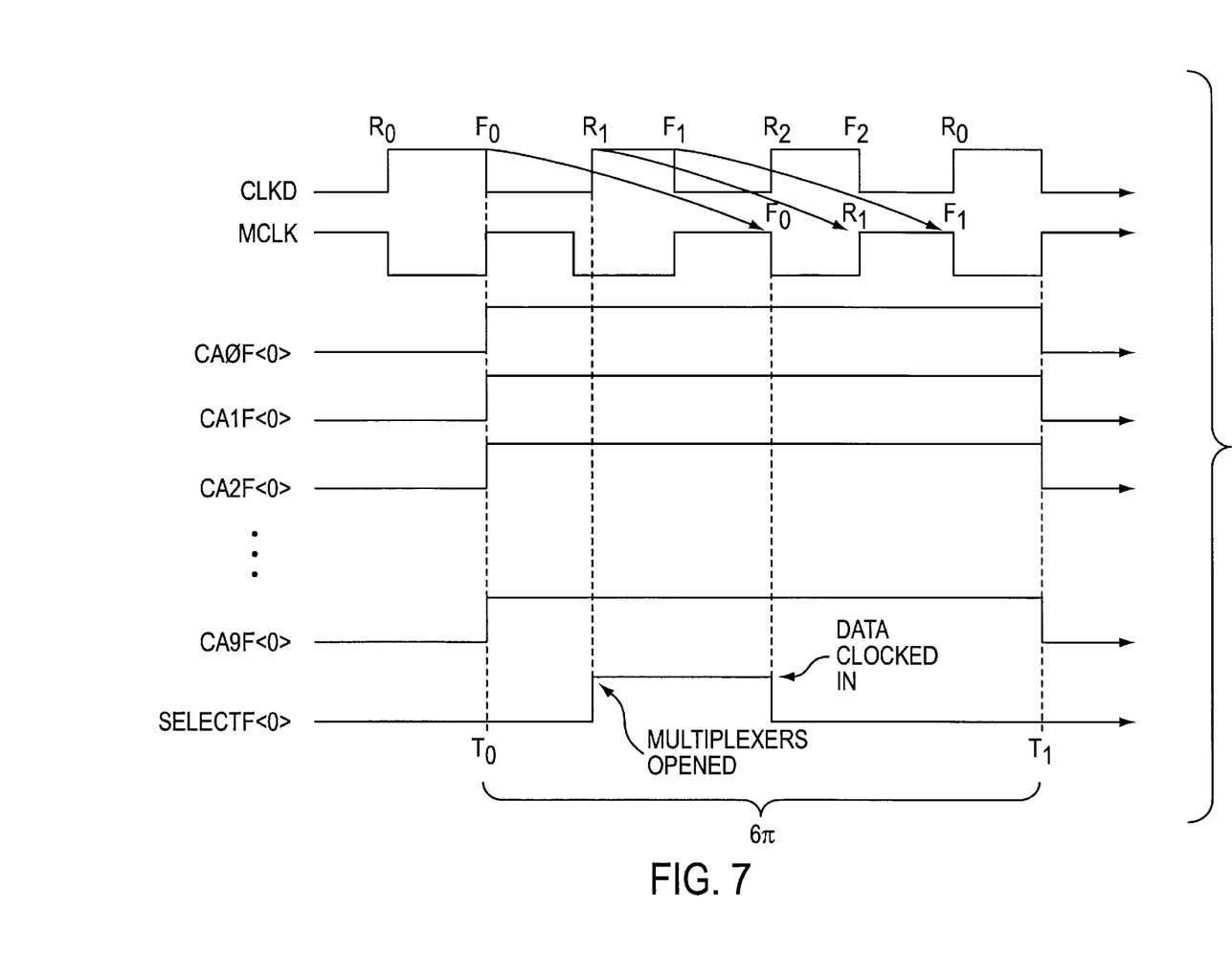
FIG. 7 is a timing diagram illustrating the timing of captured data command bits as processed by an exemplary embodiment of the invention.

Referring to FIGS. 7 and 8, the manner in which the master clock signal MCLK is centered within the middle 2π radians of the 6π radians data eye is now described (i.e., the manner in which the relationship between the delayed capture clock signal CLKD and the master clock signal MCLK is established and maintained). In FIG. 7, the 6π radians data envelope for latched falling edge command outputs CA0F<0>, ..., CA9F<0> is illustrated along with the capture clock signal CLKD, master clock signal MCLK and the first falling edge select signal SELECTF<0>. FIG. 8 illustrates the relationship between the CLKD, MCLK, latched dummy flag outputs DUMBFLAG<0:2>, reset request signal REQUEST, acknowledgment signal ACKNOWLEDGE, rising edge select signals SELECTR<0:2> and the falling edge select signals SELECTF<0:2>.

When a reset request signal REQUEST is received (at the MCLK edge pointed to by arrow A), the rising edge select signal SELECTR<0> goes high. It should be noted that the falling edge select signal SELECTF<2> would also go high to reset the falling edge counters 134 in FIG. 5. With a high rising edge select signal SELECTR<0>, the first command bit multiplexer 142 (FIG. 6) is now open to receive a latched rising edge command output CA0R<0>.

On the next rising edge of the master clock signal MCLK (arrow B), the reset request signal REQUEST is de-asserted by the acknowledgement signal ACKNOWLEDGE. At this point, the rising edge counter 132 (FIG. 5) has not been started. On the subsequent falling edge of the master clock signal MCLK (arrow C), the falling edge counter 134 (FIG. 5) begins to count, the third falling edge select signal SELECTF<2> goes low and the first falling edge select signal SELCECTF<0> goes high. It should be noted that is desirable for the reset request signal REQUEST to be de-asserted before this falling edge (i.e., arrow C) of the master clock signal MCLK.

On the next rising edge of the master clock signal (arrow R0), the rising edge counter 132 (FIG. 5) begins to count. At the same time, since the first command bit multiplexer 142 is open, the same MCLK edge clocks in the latched rising edge command output CA0R<0>. It should be noted that the same operations occur for the falling edge command outputs CA0F<0>, ..., CA9F<0> on the falling edges of the MCLK signal (FIG. 7). This is made possible by the use of the latched dummy flag outputs DUMBFLAG<0:2> by the reset circuit 120 (FIG. 5). By looking at the latched dummy flag outputs DUMBFLAG<0:2>, the reset circuit 120 can establish when the rising select signal RSEL<0> is present at the latch circuits 110, 112. The rising select signal RSEL<0> is selecting the proper rising edge register within the latch circuit 110 at which point, the first command bit multiplexer 142 should be opened to accept the latched rising edge command output CA0R<0> from the latch circuit 110 in accordance with the master clock signal MCLK. In essence, at reset, the present invention wants to ensure that the inputs to the first command bit multiplexer 142 (as well as the other multiplexers in the data generator 140) open at the right time relative the timing of the outputs of the latch circuits 110.

When the rising edge R0 of the master clock signal MCLK occurs, the SELECTR<1> goes high at the same time the rising edge command output CA0R<0> is clocked into the command bit multiplexer 142 by the master clock signal MCLK. The master clock signal MCLK and the delayed capture clock signal CLKD are synchronized. The clock edge labeled R0 is the edge that places the edge of the master clock signal MCLK within the middle 2π radians of the 6π radians data eye. The relationship between the master clock signal MCLK and the capture clock signal CLKD is maintained since the data eye is stretched to compensate for variations in the temperature and voltage of the memory device. The 6π radian envelope described herein allows for up to ±2π radians of clock phase variation due to temperature and voltage. The relationship is illustrated in FIG. 7 by the mapping of the edge labeled R0 of the capture clock signal CLKD to the R0 edge of the master clock signal MCLK.

Figure 9:
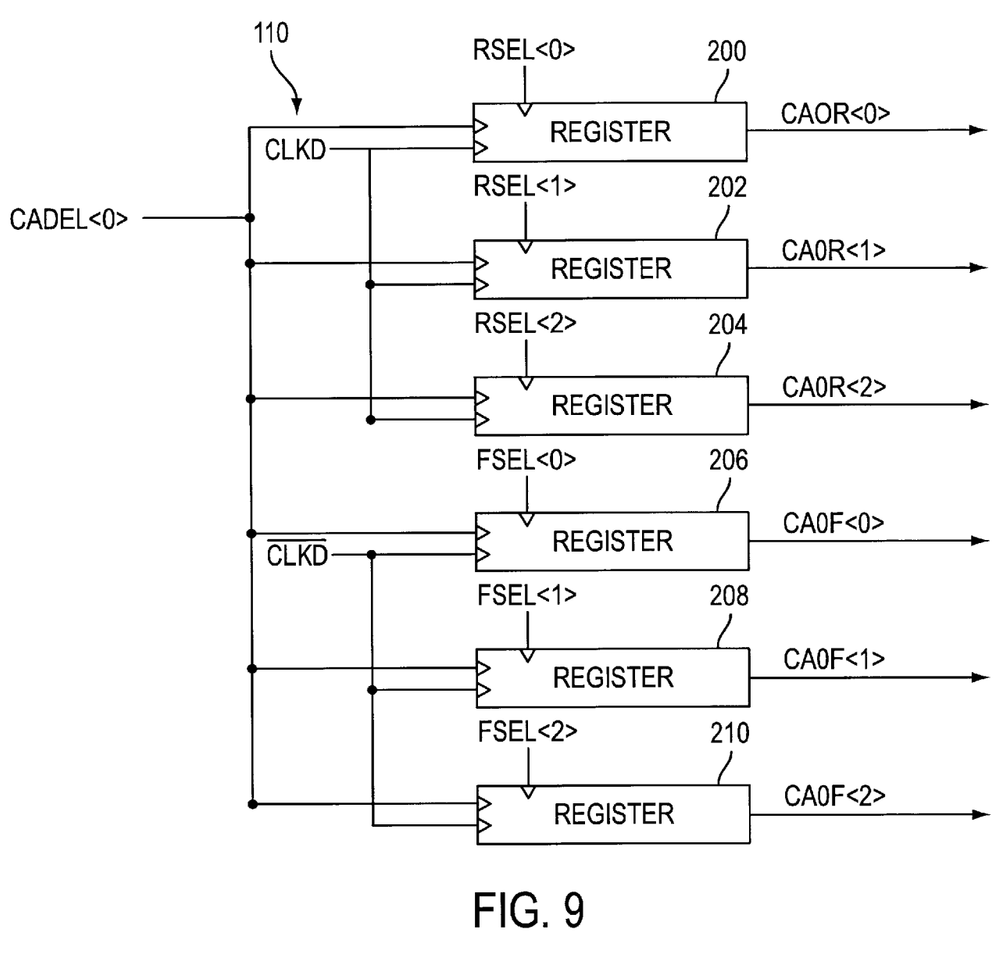
FIG. 9 is a circuit diagram illustrating an exemplary command latching circuit constructed in accordance with an exemplary embodiment of the invention.

FIG. 9 is a circuit diagram illustrating an exemplary command latch circuit 110 constructed in accordance with an exemplary embodiment of the invention. The latch circuit 110 includes six registers 200, 202, 204, 206, 208, 210. Although registers are illustrated in FIG. 9, it should be noted that any type of latching circuitry, e.g., latch, flip-flop, etc., can be used as long as the latching circuitry provides the latching capabilities described below. The first three registers 200, 202, 204 are clocked by the delayed clock signal CLKD. The first register 200 receives the first rising select signal RSEL<0>, the second register 202 receives the second rising select signal RSEL<1> and the third register 204 receives the third rising select signal RSEL<2>. The last three registers 206, 208, 210 are clocked by the inverse of the delayed clock signal $\overline{CLKD}$. The fourth register 206 receives the first falling select signal FSEL<0>, the fifth register 208 receives the second falling select signal FSEL<1> and the sixth register 210 receives the third falling select signal FSEL<2>.

All of the registers receive the delayed command signals CADEL<0> as a second input. It should be noted that since there will be ten latch circuits 110, each latch circuit 110 will input a different delay ed command signal, but for purposes of this discussion, it is presumed that the circuit 110 inputs the first delayed command signal CADEL<0>. Depending upon the generation of the rising and falling select signals RSEL<0:2>, FSEL<0:2>, the registers 200, 202, 204, 206, 208, 210 output the three latched rising edge command outputs CA0R<0:2> and the three latched falling edge command outputs CA0F<0:2>. These latched command outputs CA0R<0:2>, CA0F<0:2>, which have a data envelope spanning three full clock cycles, are then assembled and output in the correct order by the data generator 140 (illustrated in FIGS. 5 and 6).

Figure 10:
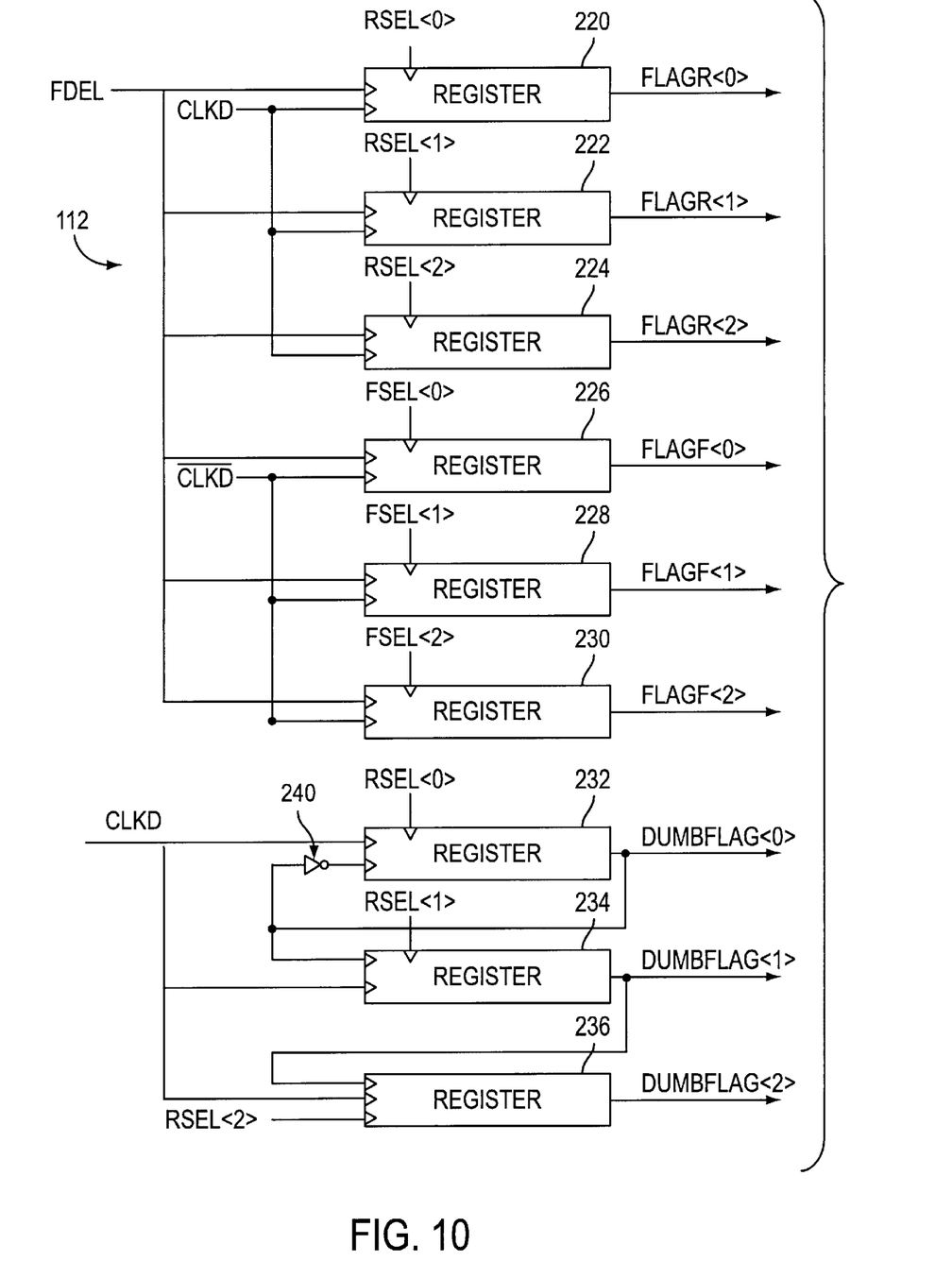
FIG. 10 is a circuit diagram illustrating an exemplary flag latching circuit constructed in accordance with an exemplary embodiment of the invention.

FIG. 10 is a circuit diagram illustrating an exemplary flag latch circuit 112 constructed in accordance with an exemplary embodiment of the invention. The latch circuit 112 includes nine registers 220, 222, 224, 226, 228, 230, 232, 234, 236. Although registers are illustrated in FIG. 10, it should be noted that any type of latching circuitry, e.g., latch, flip-flop, etc., can be used as long as the latching circuitry provides the latching capabilities described below.

The first three and last three registers 220, 222, 224, 232, 234, 236 are clocked by the delayed clock signal CLKD. The first register 220 receives the first rising select signal RSEL<e>, the second register 222 receives the second rising select signal RSEL<1> and the third register 224 receives the third rising select signal RSEL<2>. The middle three registers 226, 228, 230 are clocked by the inverse of the delayed clock signal $\overline{\text{CLKD}}$. The fourth register 226 receives the first falling select signal FSEL<0>, the fifth register 228 receives the second falling select signal FSEL<1> and the sixth register 230 receives the third falling select signal FSEL<2>.

The seventh register 232 receives the first rising select signal RSEL<0>, the eighth register 234 receives the second rising select signal RSEL<1> and the ninth register 236 receives the third rising select signal RSEL<2>. The last three registers 232, 234, 236 are connected as a toggle circuit. That is, the output of the seventh register 232 is input back into the seventh register 232 after it is inverted by an inverter 240. The output of the seventh register 232 is also input into the eighth register 234 and the output of the eighth register 234 is input into the ninth register 236. As described above with respect to FIG. 3, the last three registers 232, 234, 236 generate the three latched dummy flag outputs DUMBFLAG<0:2> by toggling data bits between a logic "1" and "0" through their respective inputs (as clocked by the delayed clock CLKD and selected by the rising select signals RSEL<0:2>). As noted above, with respect to FIG. 5, the dummy flag outputs DUMBFLAG<0:2> are used to synchronize the circuitry operating under the delayed capture data clock signal CLKD to the circuitry operating under the master clock signal MCLK.

The first six registers 220, 222, 224, 226, 228, 230 receive the delayed flag signal FDEL as a second input. Depending upon the generation of the rising and falling select signals RSEL<0:2>, FSEL<0:2>, the registers 220, 222, 224, 226, 228, 230 output the three latched rising edge flag outputs FLAGR<0:2> and the three latched falling edge flag outputs FLAGF<0:2>. These latched flag outputs FLAGR<0:2>, FLAGF<0:2> are used by the data generator 140 to assemble and output captured command data using the master clock signal MCLK (illustrated in FIGS. 5 and 6).

Figure 11:
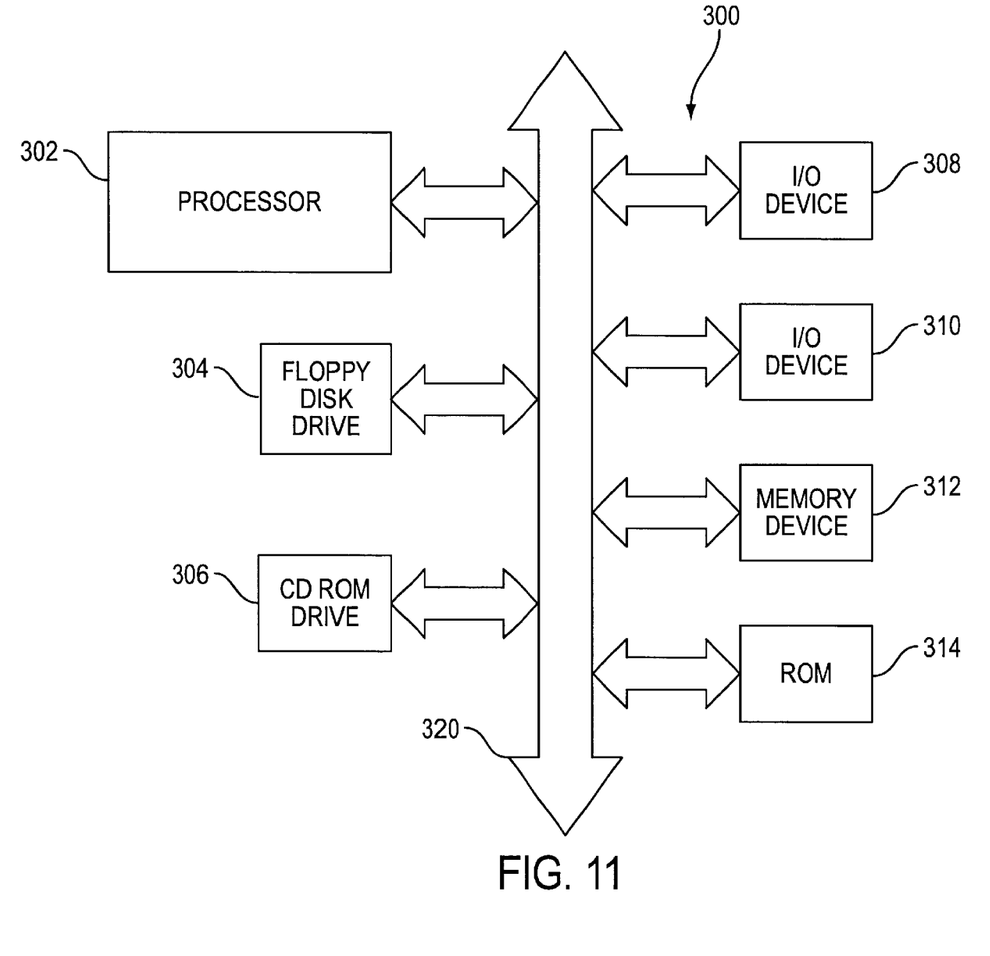
FIG. 11 is a block diagram illustrating a processor system utilizing the invention.

A memory device containing the synchronization scheme described above may be used in a processor-based system 300 of the type shown in FIG. 11. The processor-based system 300 comprises a processor 302 that communicates with a memory device 312 and an I/O device 308 over a bus 320. It must be noted that the bus 320 may be a series of buses and bridges commonly used in a processor-based system, but for convenience purposes only, the bus 320 has been illustrated as a single bus. The memory device 312 contains the synchronizing circuitry of the present invention. The memory device 312 may be any type of DRAM device including an SLDRAM. In addition, the processor 302 may itself be an integrated processor which utilizes on-chip memory devices containing the synchronizing circuitry of the present invention.

The processor-based system 300 may be a computer system, a process control system or any other system employing a processor and associated memory. A second I/O device 310 is illustrated, but is not necessary to practice the invention. The processor-based system 300 may also include read-only memory (ROM) 314 and may include peripheral devices such as a floppy disk drive 304 and a compact disk (CD) ROM drive 306 that also communicate with the processor 302 over the bus 320 as is well known in the art.

In the preceding discussion, the apparatus and method of the invention has been described with regard to a memory device which clocks data (i.e., reads or writes data) twice per clock cycle: on both the rising and falling edges of the clock. However, the present invention may be used in any memory device in which clock domains must be crossed.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A memory device comprising:

a plurality of first circuits, each first circuit having a first input for receiving a first clock signal and a second input for receiving a respective first input signal, each first circuit being controllable to latch its respective first input signal such that the first input signal has a data envelope corresponding to N number of cycles of the first clock signal, where N>1, each first circuit having at least one first output signal corresponding to the latched first input signal; and a re-timing circuit coupled to said plurality of first circuits, said re-timing circuit having a third input for receiving a second clock signal, said re-timing circuit receiving said at least one first output signal from said first circuits and outputting re-timed first output signals in accordance with transitions of the second clock signal.

2. The memory device of claim 1, wherein each first circuit has two first output signals, a first one of said first output signals corresponding to the latched first input signal associated with a first edge of the first clock signal and a second one of said first output signals corresponding to the latched first input signal associated with a second edge of the first clock signal.

3. The memory device of claim 2, wherein said re-timing circuit receives said two first output signals from each of said first circuits and combines said first output signals into said re-timed first output signals.

4. The memory device of claim 1, further comprising:
a second circuit having a fourth input for receiving the first clock signal and a fifth input for receiving a second input signal, said second circuit being controllable to latch the second input signal such that the second input signal has a data envelope corresponding to N number of cycles of the first clock signal, where N>1, said second circuit having at least one second output signal corresponding to the latched second input signal,
wherein said re-timing circuit receives said at least one second output signal from said second circuit and uses said least one second output signal to re-time said first output signals.

5. The memory device of claim 4, wherein said second circuit has two second output signals, a first one of said second output signals corresponding to the latched second input signal associated with a first edge of the first clock signal and a second one of said second output signals corresponding to the latched second input signal associated with a second edge of the first clock signal.

6. The memory device of claim 4, wherein said second circuit has three second output signals, a first one of said second output signals corresponding to the latched second input signal associated with a first edge of the first clock signal, a second one of said second output signals corresponding to the latched second input signal associated with a second edge of the first clock signal and a third one of said second output signals corresponding to a synchronization signal associated with the first clock signal.

7. The memory device of claim 6, wherein said re-timing circuit comprises:
a reset circuit for generating a synchronization request signal, said reset circuit coupled to said third one of said second output signals and the second clock signal, said reset circuit outputting said synchronization request signal based on said third one of said second output signals;
a selection circuit for generating at least one selection signal responsive to said synchronization request signal; and
a data generator receiving said at least one selection signal and said first and second output signals and generating said re-timed first output signals responsive to said at least one selection signal.

8. The memory device of claim 7, wherein said data generator generates and outputs a re-timed first one of said second output signals and a re-timed second one of said second output signals.

9. The memory device of claim 1, wherein N is three.

10. The memory device of claim 1, wherein the first clock signal is received through a delay element and the second clock signal is generated based on said first clock signal.

11. The memory device of claim 1, wherein all of said latched first input signals remains valid for a period sufficiently long enough so that said re-timing circuit can output said re-timed first output signals regardless of voltage variations effecting a timing of said first circuits and said re-timing circuits.

12. The memory device of claim 1, wherein all of said latched first input signals remains valid for a period sufficiently long enough so that said re-timing circuit can output said re-timed first output signals regardless of temperature variations effecting a timing of said first circuits and said re-timing circuits.

13. A processor system comprising:
a processor; and
memory device coupled to said processor, said memory device comprising:
a plurality of first circuits, each first circuit having a first input for receiving a first clock signal and a second input for receiving a respective first input signal, each first circuit being controllable to latch its respective first input signal such that the first input signal has a data envelope corresponding to N number of cycles of the first clock signal, where N>1, each first circuit having at least one first output signal corresponding to the latched first input signal; and
a re-timing circuit coupled to said plurality of first circuits, said re-timing circuit having a third input for receiving a second clock signal, said re-timing circuit receiving said at least one first output signal from said first circuits and outputting re-timed first output signals in accordance with transitions of the second clock signal.

14. The system of claim 13, wherein each first circuit has two first output signals, a first one of said first output signals corresponding to the latched first input signal associated with a first edge of the first clock signal and a second one of said first output signals corresponding to the latched first input signal associated with a second edge of the first clock signal.

15. The system of claim 14, wherein said re-timing circuit receives said two first output signals from each of said first circuits and combines said first output signals into said re-timed first output signals.

16. The system of claim 13, wherein said memory device further comprises:
a second circuit having a fourth input for receiving the first clock signal and a fifth input for receiving a second input signal, said second circuit being controllable to latch the second input signal such that the second input signal has a data envelope corresponding to N number of cycles of the first clock signal, where N>1, said second circuit having at least one second output signal corresponding to the latched second input signal,
wherein said re-timing circuit receives said at least one second output signal from said second circuit and uses said least one second output signal to re-time said first output signals.

17. The system of claim 16, wherein said second circuit has two second output signals, a first one of said second output signals corresponding to the latched second input signal associated with a first edge of the first clock signal and a second one of said second output signals corresponding to the latched second input signal associated with a second edge of the first clock signal.

18. The system of claim 16, wherein said second circuit has three second output signals, a first one of said second output signals corresponding to the latched second input signal associated with a first edge of the first clock signal, a second one of said second output signals corresponding to the latched second input signal associated with a second edge of the first clock signal and a third one of said second output signals corresponding to a synchronization signal associated with the first clock signal.

19. The system of claim 18, wherein said re-timing circuit comprises:
a reset circuit for generating a synchronization request signal, said reset circuit coupled to said third one of said second output signals and the second clock signal, said reset circuit outputting said synchronization request signal based on said third one of said second output signals;

a selection circuit for generating at least one selection signal responsive to said synchronization request signal; and a data generator receiving said at least one selection signal and said first and second output signals and generating said re-timed first output signals responsive to said at least one selection signal.

20. The system of claim 19, wherein said data generator generates and outputs a re-timed first one of said second output signals and a re-timed second one of said second output signals.

21. The system of claim 13, wherein N is three.

22. The system of claim 13, wherein the first clock signal is received through a delay element and the second clock signal is generated based on said first clock signal.

23. The system of claim 13, wherein all of said latched first input signals remains valid for a period sufficiently long enough so that said re-timing circuit can output said re-timed first output signals regardless of voltage variations effecting a timing of said first circuits and said re-timing circuits.

24. The system of claim 13, wherein all of said latched first input signals remains valid for a period sufficiently long enough so that said re-timing circuit can output said re-timed first output signals regardless of temperature variations effecting a timing of said first circuits and said re-timing circuits.

25. A method of operating a memory device, said method comprising the steps of:

receiving a plurality of first input signals responsive to a first clock signal;

latching the received first input signals such that each latched input signal has a data envelope corresponding to N number of cycles of the first clock signal, where N>1; and outputting re-timed first input signals in accordance with transitions of a second clock signal, wherein the data envelope of each latched first input signal ensures that the latched first input signals are valid when re-timed.

26. The method of claim 25, wherein said latching step comprises:

latching a first portion of the first input signals to a first edge of the first clock signal; and latching a second portion of the first input signals to a second edge of the first clock signal.

27. The method of claim 26, wherein said re-timing step comprises:

receiving said latched first and second portions; and combining said first and second portions in accordance with transitions of the second clock signal.

28. The method of claim 25, further comprising the steps of:

receiving a second input signal; and latching the second input signal such that the second input signal has a data envelope corresponding to N number of cycles of the first clock signal, where N>1, wherein said re-timing step receives the latched second input and uses it re-time the first input signals.

29. The method of claim 25 further comprising the steps of:

generating synchronization signals simulating a timing of the first input signals; and synchronizing circuitry responsible for capturing the first input signals to circuitry responsible for outputting the re-timed first input signals.

30. The method of claim 29, wherein said synchronizing step comprises:

generating a synchronization request signal based on said synchronization signals;

generating at least one selection signal responsive to said synchronization request signal; and generating the re-timed first input signals responsive to the at least one selection signal.

31. The method of claim 25, wherein N is three.

32. The method of claim 25, wherein all of the latched first input signals remains valid for a period sufficiently long enough so that said re-timing step circuit can output the re-timed first input signals regardless of voltage variations effecting a timing of the memory device.

33. The method of claim 25, wherein all of the latched first input signals remains valid for a period sufficiently long enough so that said re-timing step circuit can output the re-timed first input signals regardless of temperature variations effecting a timing of the memory device.

* * * * *